US012765386B2

(12) United States Patent
Homma

(10) Patent No.: US 12,765,386 B2
(45) Date of Patent: Oct. 13, 2026

(54) MANUFACTURING METHOD OF SEMICONDUCTOR DEVICE AND SEMICONDUCTOR MANUFACTURING APPARATUS

(71) Applicant: Kioxia Corporation, Tokyo (JP)

(72) Inventor: Soichi Homma, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 495 days.

(21) Appl. No.: 18/460,521

(22) Filed: Sep. 1, 2023

(65) Prior Publication Data

US 2024/0186262 A1 Jun. 6, 2024

(30) Foreign Application Priority Data

Dec. 1, 2022 (JP) ................................. 2022-192975

(51) Int. Cl.

| | |
|---|---|
| ***H10W 42/20*** | (2026.01) |
| ***G01N 21/25*** | (2006.01) |
| ***H10P 50/28*** | (2026.01) |
| ***H10W 74/01*** | (2026.01) |
| ***H10W 74/10*** | (2026.01) |
| ***H10W 90/00*** | (2026.01) |

(52) U.S. Cl.

CPC .......... *H10W 42/20* (2026.01); *G01N 21/255* (2013.01); *H10P 50/283* (2026.01); *H10W 74/01* (2026.01); *H10W 74/127* (2026.01); *H10W 90/756* (2026.01)

(58) Field of Classification Search

None

See application file for complete search history.

(56) References Cited

U.S. PATENT DOCUMENTS 5,386,430 A * 1/1995 Yamagishi ........... B23K 26/032 219/121.68
9,392,701 B2 * 7/2016 Nakao .................... H05K 3/284
9,646,908 B2 5/2017 Homma
10,196,738 B2 * 2/2019 Lee ..................... C23C 14/5813
10,312,197 B2 6/2019 Takano
10,493,559 B2 * 12/2019 Straw ..................... B23K 26/14
2007/0000885 A1 * 1/2007 Thomas ................ B08B 7/0042 219/121.68
2007/0296967 A1 * 12/2007 Gupta .................. G01J 3/2889 356/318

(Continued)

FOREIGN PATENT DOCUMENTS

JP 6219155 B2 10/2017
JP 6480823 B2 3/2019
TW 201523748 A 6/2015

*Primary Examiner* — Nishath Yasmeen

(74) *Attorney, Agent, or Firm* — Kim & Stewart LLP

(57) ABSTRACT

According to one embodiment, a method of manufacturing a semiconductor device includes etching a sealing resin so that a filler inside the resin is exposed at an outer surface of the resin. The manufacturing method further includes determining the exposed amount of the filler after etching by measuring the optical properties of the surface of the resin. Additional etching may then be performed, if necessary, such that the appropriate amount of filler is exposed from the resin. In subsequent steps, a conductive film may be deposited on the surface of the resin. For example, the conductive film may be used as shield layer of the semiconductor device.

9 Claims, 12 Drawing Sheets

(56) References Cited

U.S. PATENT DOCUMENTS

| | | | | |
|---|---|---|---|---|
| 2011/0100967 | A1* | 5/2011 | Yoo | G01N 27/00<br>219/121.73 |
| 2015/0171011 | A1* | 6/2015 | Kato | H10W 20/42<br>257/762 |
| 2015/0171021 | A1* | 6/2015 | Takano | H10W 42/20<br>257/659 |
| 2017/0025321 | A1* | 1/2017 | Homma | H10W 74/127 |
| 2022/0216164 | A1* | 7/2022 | Komatsu | H10W 42/20 |

* cited by examiner

MANUFACTURING METHOD OF SEMICONDUCTOR DEVICE AND SEMICONDUCTOR MANUFACTURING APPARATUS

CROSS-REFERENCE TO RELATED APPLICATION

This application is based upon and claims the benefit of priority from Japanese Patent Application No. 2022-192975, filed Dec. 1, 2022, the entire contents of which are incorporated herein by reference.

FIELD

Embodiments described herein relate generally to a manufacturing method of a semiconductor device and a semiconductor manufacturing apparatus.

BACKGROUND

Semiconductor devices used in communication equipment and the like employ a structure in which an outer surface of a sealing resin layer is covered with a shield layer in order to reduce electromagnetic wave interference also called electromagnetic interference (EMI).

Etching of the sealing resin layer exposes a filler embedded in the sealing resin layer. It has been found that the exposed amount of filler can contribute to the adhesion between the shield layer and the sealing resin layer. However, measuring (quantifying) the exposed amount of filler may be time-consuming and laborious.

DETAILED DESCRIPTION

Figure 1:
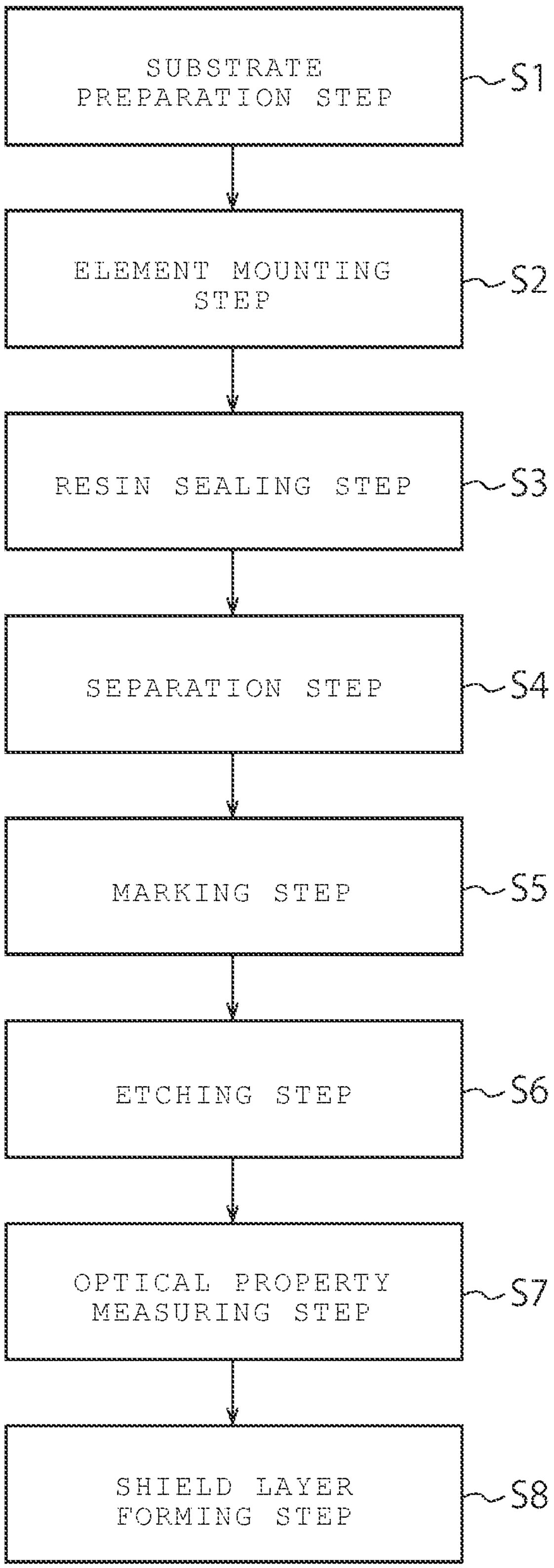
FIG. 1 is a flowchart showing an example of a manufacturing method of a semiconductor device.

In general, according to one embodiment, a manufacturing method includes etching a resin so that a filler is exposed at a surface of the resin. The manufacturing method further includes determining an exposed amount of the filler by measuring optical properties of the surface of the resin.

Hereinafter, certain example embodiments of the present disclosure will be described with reference to the drawings. The present disclosure is not limited to these specific examples. The drawings are schematic or conceptual, and the depicted dimensions, sizes, dimensional ratios, and the like of each component, element, part, or the like is not necessarily the same as those in actuality. In the specification and drawings, the same reference symbols are given to the same components, elements, parts, or the like in the drawings, and additional description thereof may be omitted as appropriate in discussion of subsequent drawings and/or examples.

FIG. 1 is a flow chart showing an example of a manufacturing method of a semiconductor device according to the present embodiment. The example of the manufacturing method of a semiconductor device shown in FIG. 1 includes a substrate preparation step (S1), an element mounting step (S2), a resin sealing step (S3), a separation step (S4), a marking step (S5), an etching step (S6), an optical property measuring step (S7), and a shield layer forming step (S8). The step details and step ordering according to the present embodiment are not necessarily limited to those shown in FIG. 1.

The substrate preparation step (S1) is a step of preparing a wiring substrate. In this example, a collective substrate on which a plurality of wiring substrates are formed in a matrix array is manufactured in this step.

The element mounting step (S2) is a step of mounting a semiconductor chip on a wiring substrate. In the element mounting step (S2), bonding may be performed to connect wiring (such as signal wiring and ground wiring) provided on the wiring substrate to the semiconductor chip with bonding wires or the like. The bonding may be performed for connection via bumps or through-silicon vias (TSVs). The chips may be directly attached and connected to each other. Various chips such as a logic chip, a NAND, a dynamic random access memory (DRAM), a controller, a discrete element, and an optical element may be used as a semiconductor chip. Two or more types of chips may be used in combination.

The resin sealing step (S3) is a step of forming a sealing resin layer so as to seal the semiconductor chip(s). For example, the sealing resin layer can be formed using a molding method such as a transfer molding method, a compression molding method, or an injection molding method. The sealing resin layer in this example contains a filler. The sealing resin layer is formed, for example, by mixing the filler with an organic resin or the like. The filler is, for example, granular or particulate and can be used for adjusting the viscosity, hardness, and other characteristics of the formed sealing resin layer. The filler content in the sealing resin layer is, for example, 50% to 90%.

The separation step (S4) is a step of dicing the substrate to separate the collective substrate into individual semiconductor devices. For dicing, a blade such as a diamond blade may be used.

The marking step (S5) is a step of stamping product information such as the product name, product number, year and week of manufacture, brand, manufacturing factory ID, and the like on the upper surface of the sealing resin layer on the wiring substrate by a laser marking device equipped with, for example, a YAG laser. In addition, a heat treatment (baking) may be performed after or as a part of the marking step.

The etching step (S6) is a step of partially removing the sealing resin layer by dry etching or the like. For example, reverse sputtering may be used to partially remove an outer portion of the sealing resin layer. The reverse sputtering is a process in which plasma is generated by applying a voltage in an atmosphere of inert gas, and the like, and substances such as oxides on the surface of the substrate are expelled as ions by the colliding ions of the inert gas. Argon gas, for example, is used as the inert gas. Other etching methods include gas etching using reactive gas, ion etching using ions, plasma etching using active radicals, and reactive ion etching (RIE) using both ions and active radicals.

The optical property measuring step (S7) is a step of measuring optical properties on a resin surface of the semiconductor device after etching.

The shield layer forming step (S8) is a step of forming a shield layer so as to cover at least the sealing resin layer of the marked semiconductor device.

As described above, the example of the manufacturing method of a semiconductor device according to the present embodiment includes at least the step of mounting a semiconductor chip on a wiring substrate, the step of forming a sealing resin layer containing the filler so as to seal the semiconductor chip, the step of removing a part of the sealing resin layer by etching, the step of measuring the optical properties on the resin surface of the semiconductor device after etching, and the step of forming the shield layer so as to cover at least the sealing resin layer.

The etching step (S6), the optical property measuring step (S7), and the shield layer forming step (S8) will be described with reference to FIGS. 2A to 2D. FIGS. 2A to 2D are cross-sectional views depicting aspects of an example of the manufacturing method of a semiconductor device according to the present embodiment.

Figure 2A:
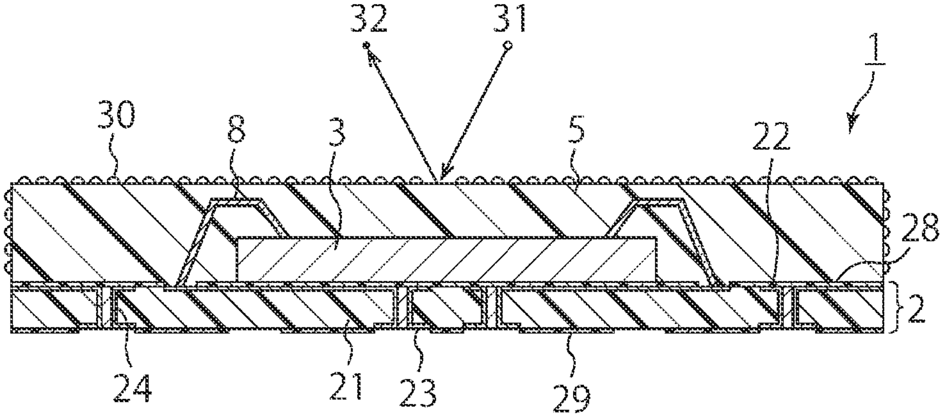
FIGS. 2A to 2D are cross-sectional views showing aspects related to a manufacturing method of a semiconductor device.

FIG. 2A is an example of the semiconductor device 1 as formed from the substrate preparation step (S1) up to the marking step (S5). In FIG. 2A, the semiconductor device 1 in process includes a wiring substrate 2 having a first surface and a second surface, a semiconductor chip 3 having electrode pads on the first surface of the wiring substrate 2, a sealing resin layer 5 provided on the first surface of the wiring substrate 2 so as to seal the semiconductor chip 3, and bonding wires 8. The first surface of the wiring substrate 2 corresponds to an upper surface of the wiring substrate 2 in FIG. 2A, the second surface corresponds to a lower surface of the wiring substrate 2 in FIG. 2A, and the first surface and the second surface of the wiring substrate 2 face each other.

The wiring substrate 2 includes an insulating layer 21 provided between the first surface and the second surface, a wiring layer 22 provided on the first surface, a wiring layer 23 provided on the second surface, a via 24 provided extending through the insulating layer 21, a solder resist layer 28 provided on the wiring layer 22, and a solder resist layer 29 provided on the wiring layer 23.

When the reverse sputtering is used in the etching step (S6), the reverse sputtering is generally performed for the purpose of removing oxides, dust, and the like adhering to the outer surface of the sealing resin layer 5. In the present embodiment, as shown in FIG. 2A, ions 31 are caused to collide with the sealing resin layer 5 by the reverse sputtering, and a part of the sealing resin layer 5 is ejected as ions 32 to partially remove an outer portion of the sealing resin layer 5. The ions 32 may be in molecular units.

In the etching step (S6), it is preferable to remove the sealing resin layer 5 until a part of filler 30 is exposed. Specifically, it is preferable to partially remove the sealing resin layer 5 from the surface to a depth of 2.5 nm or more but less than 7.5 nm. The depth of the sealing resin layer 5 to be removed may be adjusted by controlling etching conditions, an etching time, a flow rate of the inert gas, and the like. As an example, in the case of reverse sputtering, the depth of the sealing resin layer 5 to be removed may be adjusted by controlling the reverse sputtering time, the flow rate of the inert gas, and the like. Also, as shown in FIG. 2A, it is preferable to expose the filler 30 on the side surface of the sealing resin layer 5 as well as the upper surface.

A surface of the sealing resin layer 5 formed by the resin sealing step (S3) is initially smooth with relatively few irregularities. Therefore, it is considered that adhesion between the sealing resin layer 5 and the shield layer formed in the shield layer forming step (S8) may be poor without other processing. The adhesion between the shield layer and the sealing resin layer 5 can be enhanced by performing the etching, the reverse sputtering, or the like. This is due to an increase in the surface area (roughening) of the sealing resin layer 5, the formation of bondable functional groups on the resin surface by plasma processing or the like during etching of the sealing resin layer 5, and/or the activation of the exposed filler 30 so as improve contact/adhesion to the shield layer (which is a metal film). Furthermore, since adhesion between the filler 30 and a shield layer 7 is typically better than adhesion between the sealing resin layer 5 and the shield layer 7, the degree of adhesion to the shield layer 7 is improved by exposed filler 30 at the outer surface of the sealing resin layer 5.

Figure 2B:
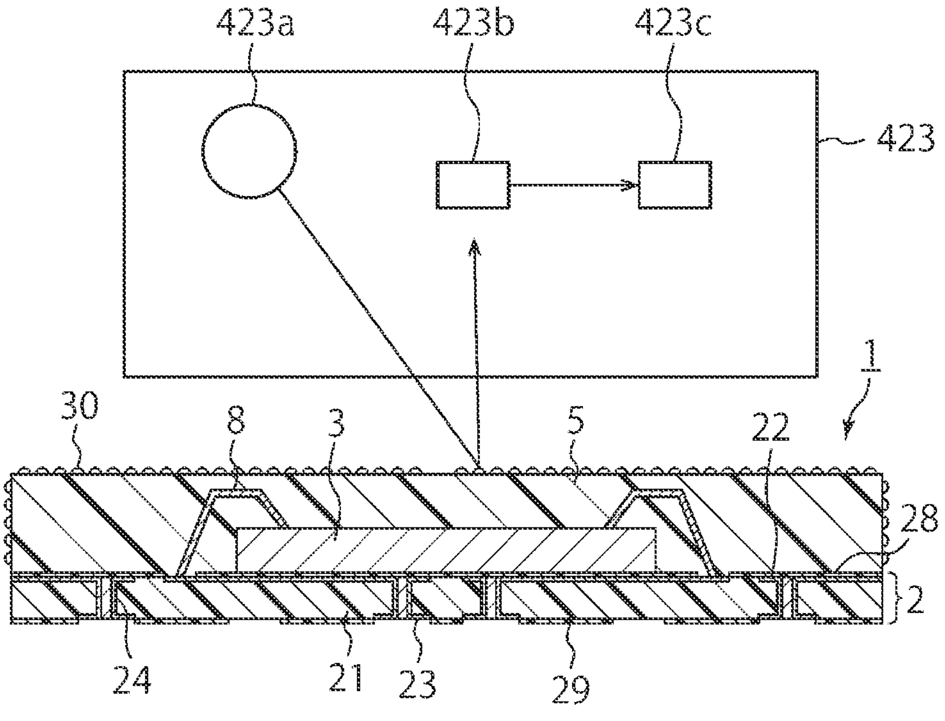

In the optical property measuring step (S7), a color (optical property) of the surface of the sealing resin layer 5 is measured using a color difference meter 423 (also referred to as optical property measuring unit 423) as shown in FIG. 2B. The initial color of the surface of the sealing resin layer 5 before etching, which serves as a reference, is measured in advance, and a color difference from that reference color is obtained. It can be confirmed that the color difference is within the standard range. By confirming that the color difference is within the standard range, it becomes possible to improve the adhesion between the sealing resin layer 5 and the shield layer 7 to be formed later in the shield layer forming step (S8). As will be described later, the exposed amount of the filler 30 is measured (quantified) based on measurement results of the optical properties in step (S7).

Figure 2C:
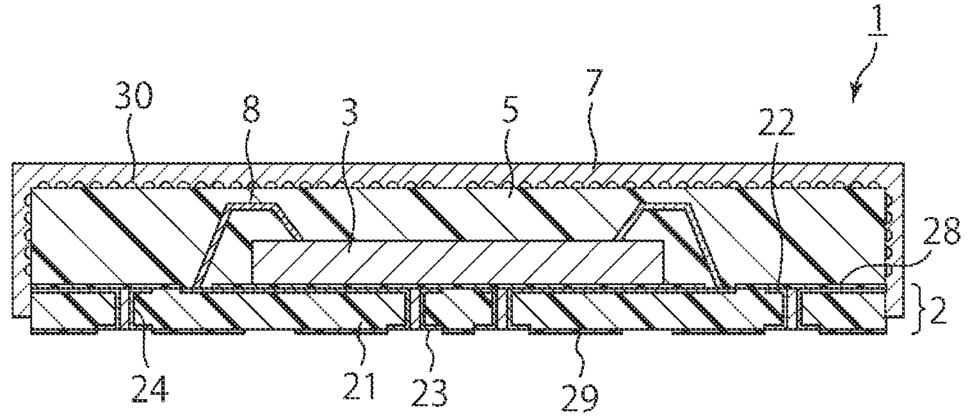

In the shield layer forming step (S8), as shown in FIG. 2C, the shield layer 7 covers at least the sealing resin layer 5. For example, etching or the reverse sputtering is performed in the etching step (S6) as described above, and then in the shield layer forming step (S8), a conductive film such as copper or silver is formed by sputtering to form the shield layer 7, and continuous processing can be performed without exposing the substrate to be processed to the atmosphere.

In addition to sputtering, the shield layer 7 can be formed by applying a conductive paste by a transfer method, a screen printing method, a spray coating method, a jet dispensing method, an inkjet method, an aerosol method, or the like. The conductive paste preferably contains, for example, silver or copper and a resin as main components and has low electrical resistivity. Alternatively, the shield layer 7 may be formed by applying a method of forming a film of copper, nickel, or the like by a non-electrolytic plating method or an electrolytic plating method.

Figure 2D:
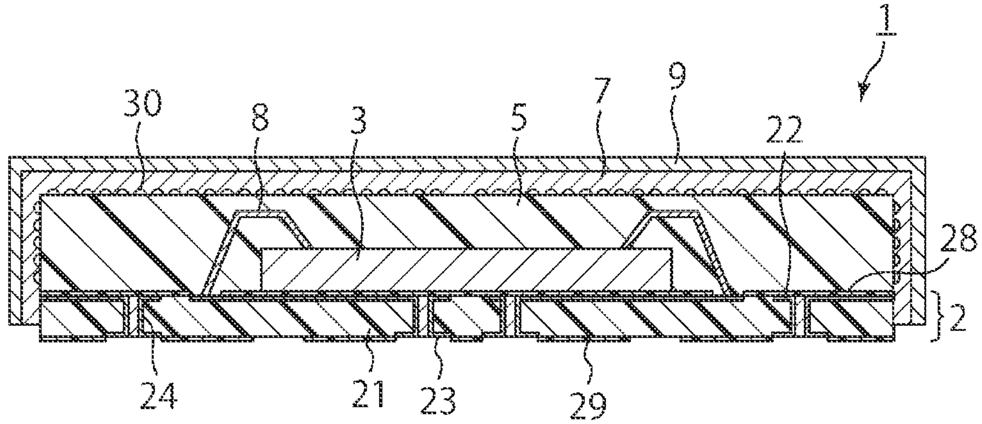

Furthermore, as shown in FIG. 2D, a protective layer 9 having excellent corrosion resistance and migration resistance may cover the shield layer 7, if considered necessary. Moreover, before forming the protective layer 9, etching such as reverse sputtering may be performed again in the same manner as in the etching step (S6). Thereby, adhesion between the shield layer 7 and the protective layer 9 can be enhanced.

After that, the electrode pads of the wiring layer 23 are provided with external connection terminals. The present disclosure is not limited to this, and for example, the external connection terminals may be provided in the element mounting step (S2). Furthermore, a step of inspecting whether the manufactured semiconductor device is a non-defective product by measuring the resistance value using the external connection terminals may be provided. The above is the description of one example of the manufacturing method of a semiconductor device according to the present embodiment.

Next, a structural example of a semiconductor device that can be manufactured by the manufacturing method according to the present embodiment will be described.

Figure 3A:
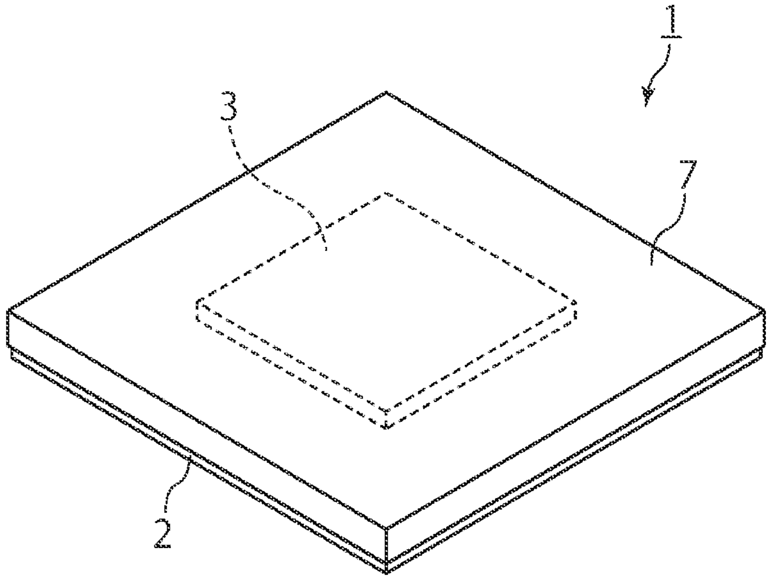
FIG. 3A is a perspective view showing a structural example of a semiconductor device.
Figure 3B:
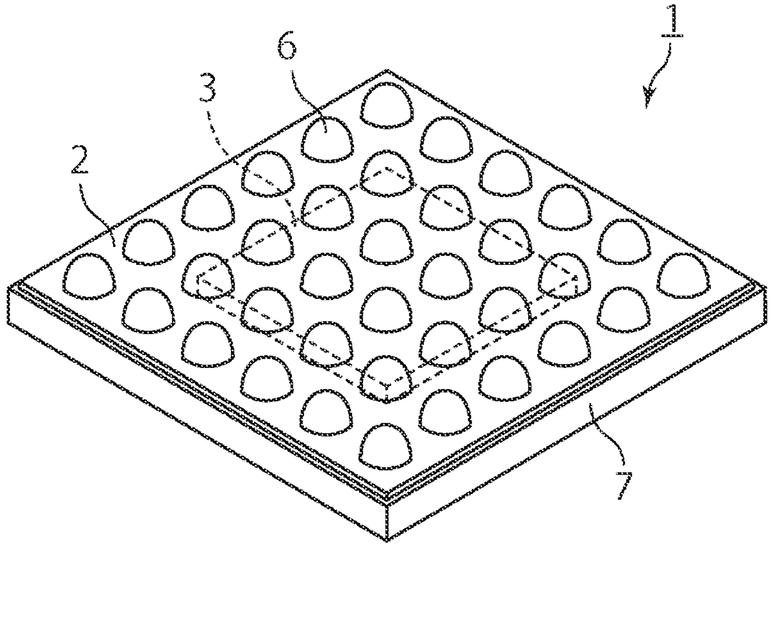
FIG. 3B is another perspective view showing a structural example of a semiconductor device.

FIGS. 3A and 3B are perspective views showing a structural example of the semiconductor device 1. FIG. 3A is a perspective view of a front surface side. FIG. 3B is a perspective view of a rear surface side. The semiconductor device 1 shown in FIGS. 3A and 3B includes the wiring substrate 2, the semiconductor chip 3, the shield layer 7 covering the semiconductor chip 3, and external connection terminals 6 (with solder balls). Although sizes of the external connection terminals 6 are depicted as uniform in FIG. 3B, the size and position of each external connection terminal 6 is not limited to those in FIG. 3B. In addition, a ball grid array (BGA) semiconductor device is shown in FIGS. 3A and 3B, but the present disclosure is not limited to this, and other device form factors may be adopted.

Figure 4:
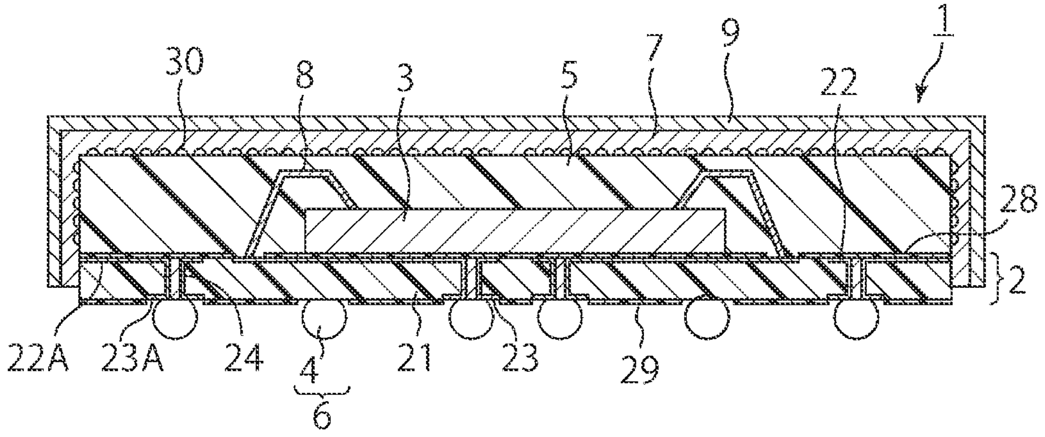
FIGS. 4 to 6 are cross-sectional views showing structural examples of a semiconductor device.

FIG. 4 is a cross-sectional view showing a structural example of the semiconductor device shown in FIGS. 3A and 3B. The semiconductor device 1 shown in FIG. 4 includes the semiconductor chip 3 provided on the first surface of the wiring substrate 2, the sealing resin layer 5 provided on the first surface of the wiring substrate 2 so as to seal the semiconductor chip 3, the external connection terminals 6 provided on the second surface, the shield layer 7 covering at least the sealing resin layer 5, the bonding wires 8, and the protective layer 9 covering the shield layer 7.

The first surface of the wiring substrate 2 corresponds to the upper surface of the wiring substrate 2 in FIG. 4, the second surface corresponds to the lower surface of the wiring substrate 2 in FIG. 4, and the first surface and the second surface of the wiring substrate 2 face each other.

The wiring substrate 2 includes insulating layer 21 between the first surface and the second surface, the wiring layer 22 provided on the first surface, the wiring layer 23 provided on the second surface, the via 24 provided through the insulating layer 21, the solder resist layer 28 provided on the wiring layer 22, and the solder resist layer 29 provided on the wiring layer 23.

As the insulating layer 21, a silicon substrate, a glass substrate, a ceramic substrate, a resin substrate such as glass epoxy, or the like may be used.

The sealing resin layer 5 contains a filler comprising an inorganic material such as $SiO_2$. For example, a mixture of the filler and an insulating organic resin material or the like may be used. For example, a mixture of the filler and an epoxy resin may be used.

The wiring layer 22 and the wiring layer 23 are provided with, for example, the signal wiring, the power supply wiring, the ground wiring, and the like. The wiring layer 22 and the wiring layer 23 are not limited to a single-layer structure, but may have a stacked structure in which a plurality of conductive layers electrically connected through an opening in an insulating layer with the insulating layer sandwiched therebetween are stacked. For the wiring layers 22 and 23, copper, silver, or a conductive paste containing these metals may be used, and the surfaces thereof may be plated with nickel, gold, or the like, if necessary.

A plurality of the vias 24 are provided through the insulating layer 21. Each via 24 has, for example, a conductor layer provided on the inner surface of an opening penetrating the insulating layer 21 and a hole-filling material with which the inside of the conductor layer is filled. For the conductor layer, copper, silver, or a conductive paste containing these metals may be used, and the surfaces thereof may be plated with nickel, gold, or the like, if necessary. The hole-filling material is formed using, for example, an insulating material or a conductive material. The present disclosure is not limited to this, and for example, the vias 24 may be formed by filling the through holes with a metal material (copper or the like) by plating or the like.

As the external connection terminals 6, a signal terminal, a power terminal, a ground terminal, and the like can be provided. An external connection terminal 6 is electrically connected to the wiring layer 22 through the wiring layer 23 and the via 24. The external connection terminals 6 have thereon solder balls 4. The solder balls 4 are provided on the electrode pads of the wiring layer 23. A land (landing) may be provided instead of a solder ball 4.

The shield layer 7 contacts the filler 30 of the sealing resin layer 5. The shield layer 7 has a function of blocking unnecessary electromagnetic waves radiated from the semiconductor chip 3 or the like so as to reduce leakage of unnecessary electromagnetic waves to the outside. As the shield layer 7, it is preferable to use a metal layer containing, for example, copper, silver, gold, nickel, or the like, which has a low electrical resistivity. Iron, chromium, titanium, palladium, platinum, aluminum, zinc, vanadium, niobium, tantalum, cobalt, tin, indium, gallium, molybdenum, tungsten, stainless steel alloys (SUS304, SUS316, etc.), or the like may be used for the shield layer 7. A composite film as well as a single film can be used for the shield layer 7. For example, in addition to a layer of copper or the like, a composite film combining the materials of the shield layer 7 may be used as the protective layer 9. For example, titanium, chromium, or a stainless alloy (SUS304, SUS316, etc.) may be used for the protective layer 9. The shield layer 7 may have a three-layer structure with an underlayer, a layer of copper or the like, and the protective layer 9. As an underlayer, materials such as iron, chromium, titanium, palladium, platinum, aluminum, zinc, vanadium, niobium, tantalum, cobalt, tin, indium, gallium, molybdenum, tungsten, and stainless steel alloys (SUS304, SUS316, etc.), oxides and nitrides thereof, or composite films of two or more of these materials, oxides, and nitrides thereof may be used. In general, adhesion can be further improved by adding the underlayer. A thickness of the shield layer 7 in a composite film excluding the protective layer 9 can be, for example, 0.1 μm to 20 μm. When the thickness of the shield layer 7 is less than 0.1 μm, the resistance value of the shield layer 7 is generally too high, making it difficult to obtain the appropriate electromagnetic wave shielding effect. When the thickness of the shield layer 7 exceeds 20 μm, film stress usually becomes too large, and the shield layer 7 may peel off spontaneously or the like. A thickness of the protective layer 9 can be, for example, 0.01 μm to 5 μm. When the thickness of the protective layer 9 is less than 0.01 μm, the protective effect is weak. When the thickness of the protective layer 9 exceeds 5 μm, the film stress becomes too large, and the shield layer 7 may peel off. Furthermore, there is also a problem that the film formation cost increases with thicker films. A thickness of the underlayer may be, for example, 0.01 μm to 5 μm. When the thickness of the underlayer is less than 0.01 μm, the improvement in adhesion provided is weak. When the thickness of the underlayer exceeds 5 μm, the film stress becomes too large, and the shield layer 7 may be peeled off. By using a metal layer having a low electrical resistivity as the shield layer 7, it is possible to reduce leakage of unnecessary electromagnetic waves.

The thickness of the shield layer 7 is preferably set based on electrical resistivity of the shield layer 7. For example, it is preferable to set the thickness of the shield layer 7 so that a sheet resistance value obtained by dividing the electrical resistivity of the shield layer 7 by its thickness is 0.5 Ω or less. By setting the sheet resistance value of the shield layer 7 to 0.5 Ω or less, leakage of unnecessary electromagnetic waves can be reduced with good reproducibility.

The bonding wires 8 are electrically connected to the wiring layer 22 and the semiconductor chip 3. For example, the bonding wires 8 electrically connect the semiconductor chip 3 to the signal wiring and the ground wiring.

As shown in FIG. 4, a structure may be employed in which the shield layer 7 covers at least a part of a side surface of the wiring substrate 2, a side surface of the wiring 22A of the wiring layer 22 is exposed at the side surface of the wiring substrate 2, and the side surface of the wiring 22A is in contact with the shield layer 7. The wiring 22A can function as the ground wiring. By electrically connecting the wiring 22A to the shield layer 7, the unnecessary electromagnetic waves can escape to the outside through the ground wiring. The structure is not limited to this, and a structure in which a side surface of the wiring 23A of the wiring layer 23 is in contact with the shield layer 7 may be employed. In this case, wiring 23A has a function as the ground wiring.

In the wiring 22A of the wiring layer 22, a plurality of exposed portions exposed to the side surface of the wiring substrate 2 may be provided. As a result, the area of the wiring 22A exposed to the side surface of the wiring substrate 2 can be increased, so that the connection resistance between the wiring 22A and the shield layer 7 can be reduced, and the shielding effect can be enhanced. In addition, in the semiconductor device 1 of the present embodiment, by locating the ground wiring along a periphery of the wiring substrate 2, the ground wiring itself functions as a part of a shield layer, and leakage of unnecessary electromagnetic waves can be reduced.

As the protective layer 9, resin such as polyimide resin can be used in addition to a metal such as titanium, chromium, and stainless alloy (SUS304, SUS316, etc.).

The structure of the semiconductor device 1 of the present embodiment is not limited to the above structure. Another structural example of the semiconductor device 1 will be described with reference to FIGS. 5 and 6. In the semiconductor device 1 shown in FIGS. 5 and 6, the same parts as those of the semiconductor device shown in FIG. 4 are denoted by the same reference symbols.

Figure 5:
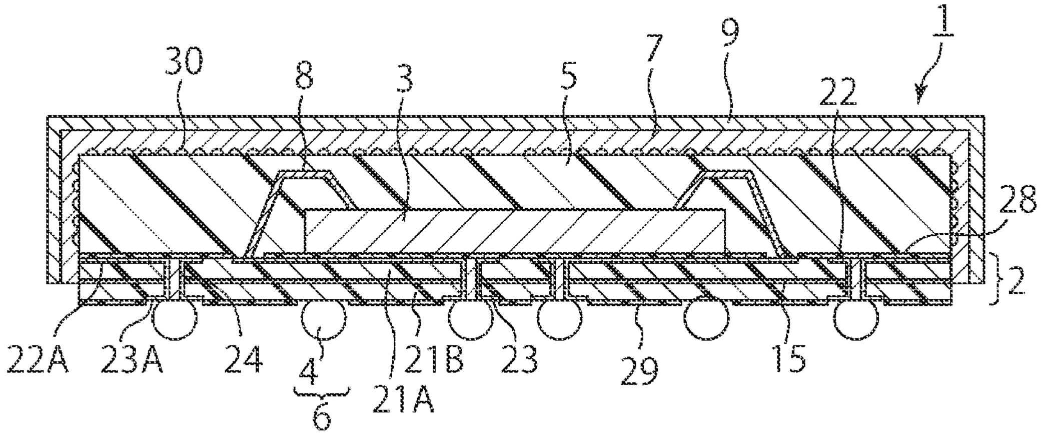

The semiconductor device 1 shown in FIG. 5 includes an insulating layer 21A and an insulating layer 21B instead of the insulating layer 21 of the semiconductor device 1 shown in FIG. 4, and further includes a conductive layer 15 between the insulating layer 21A and the insulating layer 21B. The other components are similar to those already described for the previous examples.

As the insulating layer 21A and the insulating layer 21B, for example, a substrate otherwise similar to the insulating layer 21 can be used.

The conductive layer 15 preferably overlaps at least a part of the semiconductor chip 3. The conductive layer 15 functions as the ground wiring. The conductive layer 15 is preferably a solid film or a mesh film.

The conductive layer 15 is formed by using, for example, a photolithography technique, and removing a part of a conductive film using a patterned resist film as a mask for processing. As the conductive film, it is preferable to use a material that can also be used for the shield layer 7.

A via 24 is provided through the insulating layer 21A, the conductive layer 15, and the insulating layer 21B. The via 24 electrically connected to a signal wiring or the like can be electrically separated (isolated) from the conductive layer 15. For example, by forming openings in the conductive layer 15, the conductive layer 15 can be kept electrically separated from the vias 24 that are electrically connected to signal wiring or the like. The wiring 22A and the wiring 23A can be electrically connected to the conductive layer 15. As for the configuration of the wiring 22A, the wiring 23A, and the via 24, the description of the semiconductor device 1 in FIG. 4 is applicable.

By providing the conductive layer 15, leakage of unnecessary electromagnetic waves through the wiring substrate 2 can be reduced. The side surfaces (e.g., outer edges) of the conductive layer 15 are preferably in contact with the shield layer 7. As a result, it is possible to increase the number of connection points with the shield layer 7, so that connection failure between the external connection terminal 6 serving as the ground terminal and the shield layer 7 can be reduced, and a connection resistance can be reduced, which can enhance the shielding effect.

Figure 6:
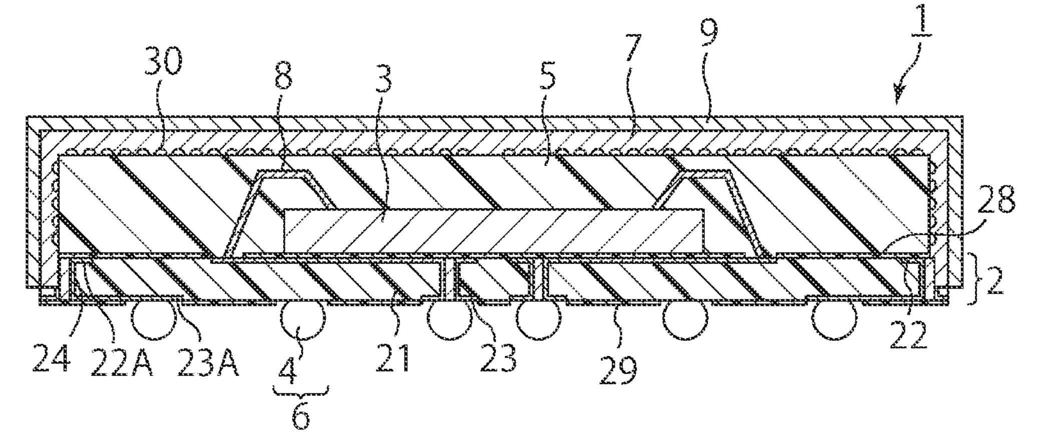

The semiconductor device 1 shown in FIG. 6 has a structure in which some of the vias 24 of the semiconductor device 1 shown in FIG. 4 are moved to the periphery of the wiring substrate 2. These vias 24 at the outer edge of the substrate 2 have a partial shape (e.g., half-circle, etc.) as compared to full vias 24 in the interior region of the substrate 2. The wiring 22A and the wiring 23A function as the ground wiring. A cut surface of the via 24 is exposed at the side surface of the wiring substrate 2 and is in contact with the shield layer 7. In the semiconductor device 1 shown in FIG. 6, the via 24 a half-circle, but the shape of the outer edge vias 24 is not limited to this. These via 24 may be cut in this manner for the full thickness (length) of via 24 or only partially (less than full thickness). Also, the cut plane does not necessarily have to pass through the center of the via 24, and it is sufficient that the cut plane includes a part of the via 24.

By bringing the cut surface of the via 24 into contact with the shield layer 7, the contact area between the via 24 and the shield layer 7, in other words, the contact area between the ground wiring and the shield layer 7 can be increased, thereby reducing the connection resistance, which can enhance the shielding effect. It should be noted that, in a modification, the insulating layer 21A and the insulating layer 21B of the semiconductor device 1 shown in FIG. 5 may be provided instead of the insulating layer 21 of the semiconductor device 1 shown in FIG. 6, and likewise the conductive layer 15 may be provided.

As described above, in the semiconductor device 1 of the present embodiment, the shield layer 7 can reduce unnecessary leakage of electromagnetic waves such as those radiated by the semiconductor chip 3 and the wiring substrate 2. Therefore, the semiconductor device 1 of the present embodiment is suitable for applications such as a mobile information communication terminal such as a smartphone, a tablet information communication terminal, and the like.

EMBODIMENT

An actually manufactured semiconductor device 1 and the results of an adhesion test will be described.

First Embodiment

Figure 7:
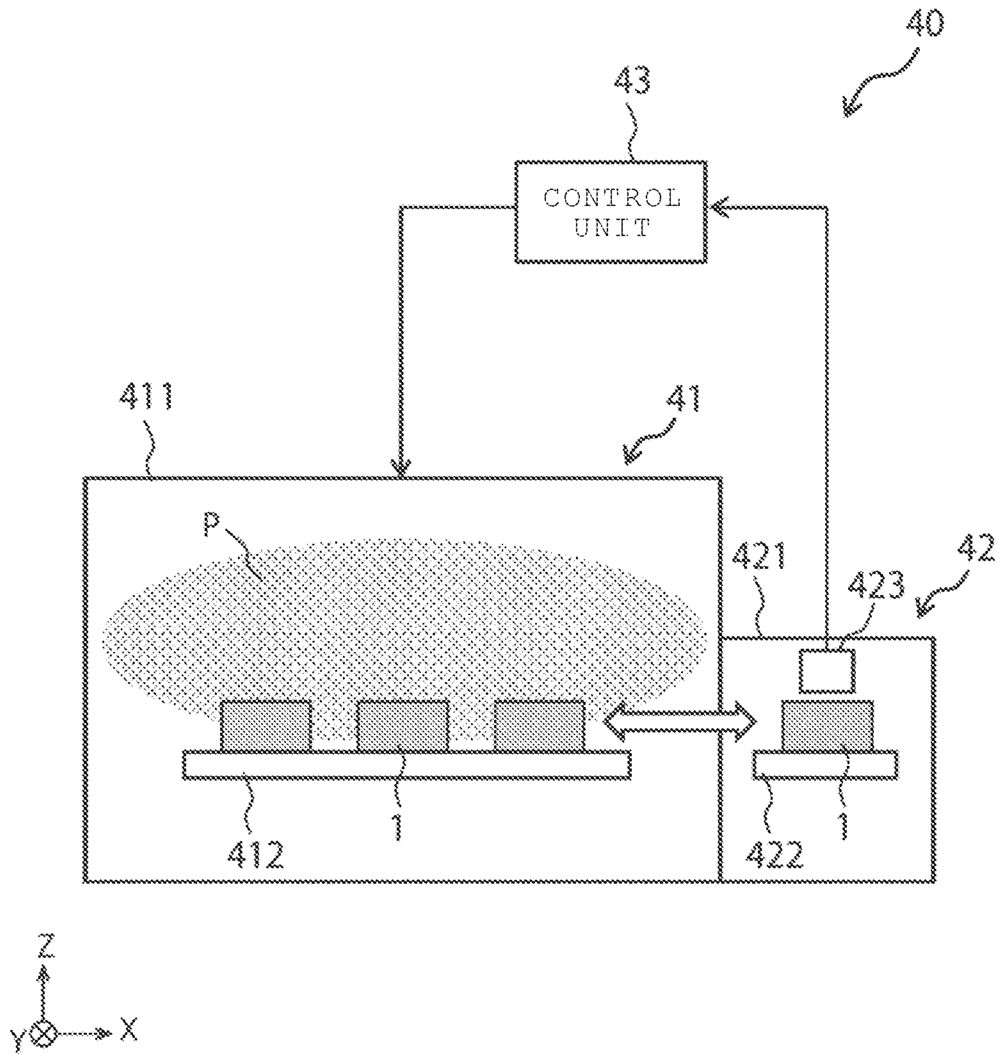
FIG. 7 depicts an example of a configuration of a semiconductor manufacturing apparatus in a first embodiment.

FIG. 7 depicts an example of the configuration of a semiconductor manufacturing apparatus 40 in a first embodiment. The semiconductor manufacturing apparatus is an apparatus used at least in the etching step (S6) and the optical property measuring step (S7).

FIG. 7 shows an X direction and a Y direction parallel to a surface of the wiring substrate 2 and perpendicular to each other, and a Z direction perpendicular to the surface of the wiring substrate 2. In the present specification, a +Z direction is treated as the upward direction and a −Z direction is treated as the downward direction. The −Z direction may or may not coincide with the direction of gravity.

The semiconductor manufacturing apparatus 40 includes an etching device 41, an optical property measuring device 42, and a control unit 43.

The etching device 41 (etching unit) etches the sealing resin layer 5 so that the filler 30 is exposed from the surface of the sealing resin layer 5. The etching device 41 has a chamber 411 and a stage 412.

The chamber 411 accommodates the stage 412.

A plurality of semiconductor devices 1 can be placed on the stage 412. The stage 412 also functions as a lower electrode for plasma processing. The plasma P is generated, for example, by applying a DC voltage or an AC voltage to the stage 412 or an upper electrode of the chamber 411. The number of semiconductor devices 1 placed on the stage 412 and subjected to plasma processing is not limited to the example shown in FIG. 7.

The optical property measuring device 42 has a chamber 421, a stage 422, and an optical property measuring unit 423.

The chamber 421 accommodates the stage 422.

A semiconductor device 1 etched by the etching device 41 is subsequently placed on the stage 422. The number of semiconductor devices 1 placed on the stage 422 is not limited to the example shown in FIG. 7. All of the semiconductor devices 1 on the stage 412 are conveyed into the chamber 421, and optical property measurements may be performed on one or more semiconductor devices 1.

The optical property measuring unit 423 measures optical properties of the surface of a sealing resin layer 5. More specifically, the optical property measuring unit 423 measures (quantifies) an exposed amount of the filler 30 by measuring the optical properties of the surface of the sealing resin layer 5. Thereby, the exposed amount of the filler 30 can be measured (quantified).

The optical property measuring unit 423 is provided above the semiconductor device 1, for example. The optical property measuring unit 423 is preferably provided close to the upper surface of the semiconductor device 1.

The optical property measuring unit 423 is, for example, a color difference meter that measures a color difference for the surface of the sealing resin layer 5. However, the optical property measuring unit 423 is not limited to a color difference meter.

As shown in FIG. 2B, the optical property measuring unit 423 (as the color difference meter) has a light source 423*a*, a color measuring unit 423*b*, and a calculation unit 423*c*.

The light source 423*a* irradiates the semiconductor device 1 with light.

The color measuring unit 423*b* receives the light reflected by the semiconductor device 1 and measures the color of the surface of the sealing resin layer 5.

The calculation unit 423*c* calculates a color difference between a reference color and the color just measured by the color measuring unit 423*b*. Thereby, a color difference is measured by the optical property measuring unit 423. Details of color difference calculation will be described later with reference to FIG. 8.

The color measuring unit 423*b* measures a color of light reflected at one point on the surface of the sealing resin layer 5, as shown in FIG. 2B. However, the color measuring unit 423*b* can measure the color of the light reflected in a range of, for example, several millimeters (mm) square to 10 mm square. Therefore, the color measuring unit 423*b* generally averages and measures the color of the light reflected across the entire upper surface of the sealing resin layer 5, for example.

The control unit 43 controls the etching device 41 and the optical property measuring device 42. The control unit 43 controls the etching device 41 and the optical property measuring device 42 so as to alternately perform etching processing and optical property measurement on at least one semiconductor device 1 among the plurality of semiconductor devices 1 to be processed by the etching device 41.

Also, the control unit 43 controls the etching device 41 based on the measurement result of the optical property measuring device 42. The control unit 43 controls the etching device 41 so as to etch the sealing resin layer 5 by changing the etching conditions according to the measurement results.

The control unit 43 shown in FIG. 7 is provided outside the etching device 41 and the optical property measuring device 42. However, the control unit 43 may be provided in the etching device 41 or the optical property measuring device 42, for example.

Next, a relationship between the measured color difference and the exposed amount of the filler 30 will be described.

Figure 8:
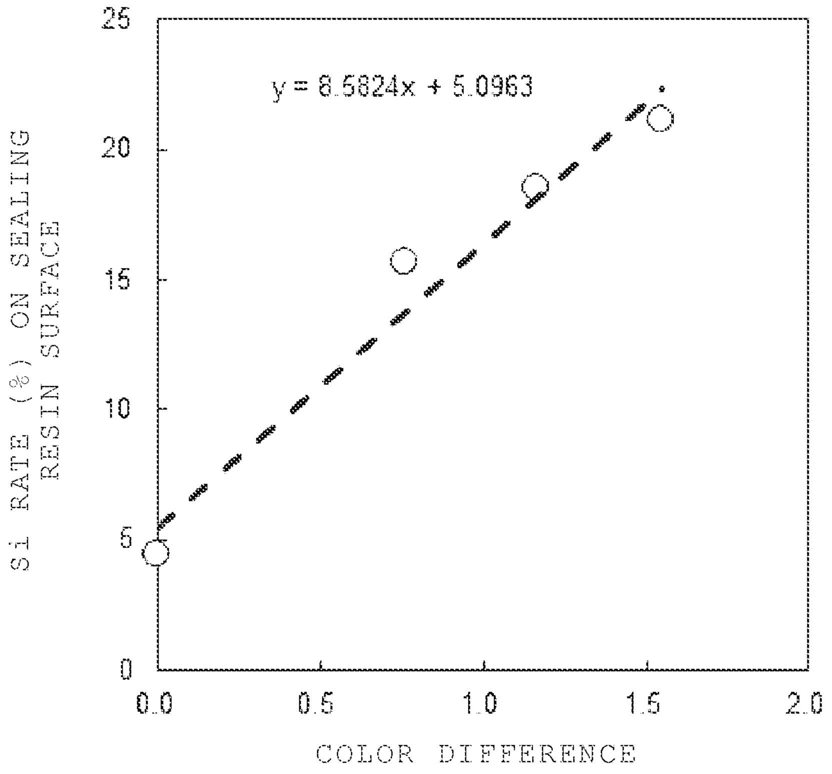
FIG. 8 is a graph depicting an example of a relationship between a color difference and an exposed amount of filler in a first embodiment.

FIG. 8 is a graph showing an example of the relationship between the color difference $\Delta E^*_{ab}$ (or represented by $\Delta E_{Lab}$) and the exposed amount of the filler 30 according to the first embodiment. A case where the filler 30 contains $SiO_2$ is described as an example.

In FIG. 8, the horizontal axis indicates the color difference value ($\Delta E^*_{ab}$) for the surface of the sealing resin layer 5, and the vertical axis indicates a silicon rate value (Si rate (%)) on a sealing resin surface. The silicon rate value for the sealing resin surface corresponds to the exposure amount of the filler 30 at the surface of the sealing resin layer 5. The silicon rate value for the sealing resin surface is the result from analysis by XPS (X-ray Photoelectron Spectroscopy).

The color difference $\Delta E^*_{ab}$ is the difference in numerical values (coordinates) in the L*a*b* color space between two points to be measured. The color difference $\Delta E^*_{ab}$ is expressed by Equation 1 below in notation using $\Delta L^*$ as the difference in L* values, $\Delta a^*$ as the difference in a* values, and $\Delta b^*$ as the difference in b* values between two points to be measured. Equation 1: $\Delta E^*_{ab}$ (or $\Delta E_{Lab}$)$=[(\Delta L^*)^2+(\Delta a^*)^2+(\Delta b^*)^2]^{1/2}$ The two points to be measured are the color of the reference sample (reference color) and the color of the actual sample (measurement color). The reference color is the color measured after a first etching was performed. The first etching is, for example, mild etching (a light etching) performed with argon (Ar) gas (that does not contain nitrogen gas ($N_2$)) for several seconds to 10 seconds. The first etching is performed, for example, in order to measure the reference color after the removal of impurities and the like from the surface of the sealing resin layer 5 but before any substantial etching of the sealing resin layer 5. By using the color measured after the first etching is performed as the reference color, the influence of impurities and the like can be reduced, and the exposed amount of the filler 30 can be measured (quantified) more appropriately. The actual measurement color is the color measured after a second etching is performed. The second etching is, for example, etching performed with gas containing both argon gas and nitrogen gas for about 2 to 10 minutes. As the amount or ratio of nitrogen gas increases in the etch gas, the sealing resin layer 5 is more quickly etched.

That is, the etching device 41 etches the sealing resin layer 5 a plurality of times. The optical property measuring unit 423 measures the first color of the surface of the sealing resin layer 5 after performing the first etching. The first color is the reference color. The optical property measuring unit 423 measures the second color of the surface of the sealing resin layer 5 after performing the second etching. The second color is the actual measurement color. The second etching is etching performed after the first etching. The optical property measuring unit 423 calculates the color difference between the first color and the second color.

The second etching and measurement of the second color may be repeated multiple times until the desired color difference $\Delta E^*_{ab}$ is finally obtained. In addition, different reference colors can be used for semiconductor devices 1 using different materials for the sealing resin layers 5. That is, it is necessary to measure a reference color for each material used for a sealing resin layer 5.

In FIG. 8, the data point with zero color difference $\Delta E^*_{ab}$ indicates the measured color difference without the second etching being performed. As the color difference $\Delta E^*_{ab}$ increases, the Si rate value for the sealing resin surface increases. From the four data points, it can be seen that there is a substantially linearly proportional relationship between the color difference and the Si rate on the sealing resin surface. This is probably because the luminance (L* value) of the color difference $\Delta E^*_{ab}$ increases as the exposed amount of the filler 30 increased due to etching.

Figure 9A:
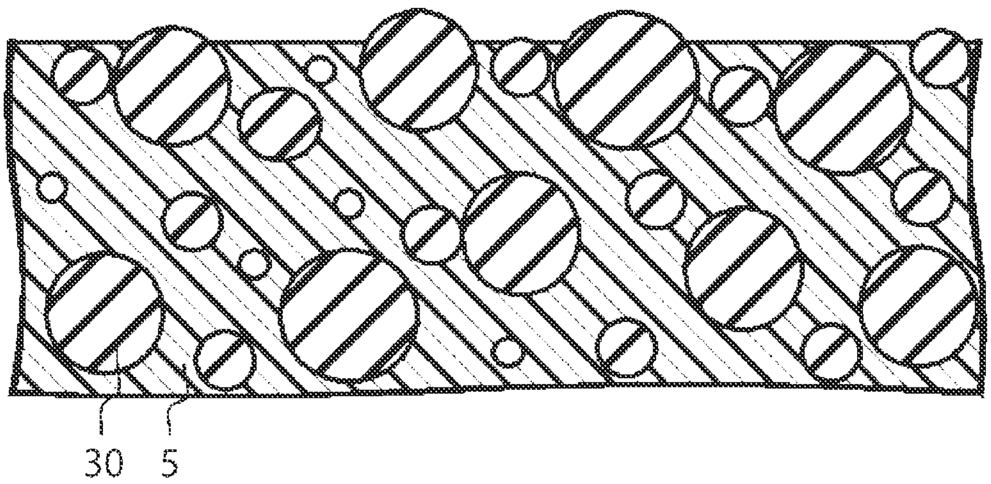
FIGS. 9A and 9B are schematic cross-sectional views showing examples of a surface of a sealing resin layer.
Figure 9B:
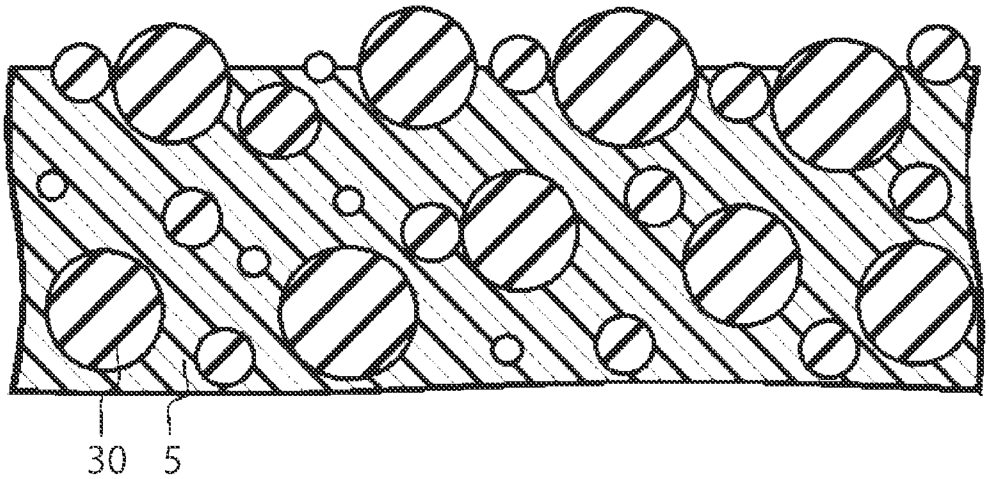

FIGS. 9A and 9B are schematic cross-sectional views showing examples of the surface of the sealing resin layer 5. The sealing resin layer 5 shown in FIGS. 9A and 9B is etched from the upper surface side. FIG. 9B shows a case where the etching amount is greater than that in FIG. 9A.

As shown in FIGS. 9A and 9B, the greater the etching amount, the greater the exposed amount of the filler 30. As a result, the optical properties of the surface of the sealing resin layer 5 are affected by the optical properties of the filler 30. That is, the difference in the exposed amount of the filler 30 leads to the difference in the measured optical properties of the surface of the sealing resin layer 5 such as measured color.

The dashed line shown in FIG. 8 indicates the results of a fitting to the experimental values. As a result of fitting with a linear function, $y=8.5824x+5.0963$ was obtained. By applying the measurement result of the color difference $\Delta E^*_{ab}$ of the surface of the sealing resin layer 5 to the correlation shown in FIG. 8, the exposed amount of the filler 30 can be more easily measured (quantified) and managed.

Figure 10:
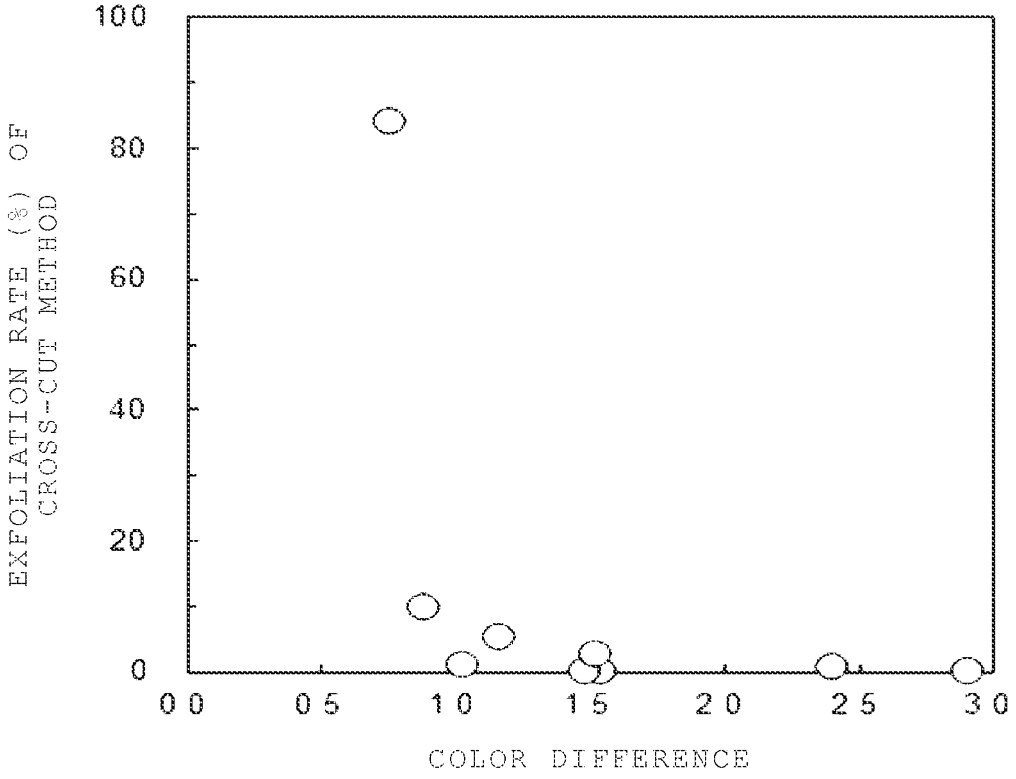
FIG. 10 is a graph depicting results of an adhesion test of a semiconductor device of a first embodiment.

FIG. 10 is a graph showing an example of the relationship between the color difference $\Delta E^*_{ab}$ and an exfoliation rate of a cross-cut method in the first embodiment.

In FIG. 10, the horizontal axis indicates the color difference $\Delta E^*_{ab}$, and the vertical axis indicates the ratio of the samples peeled off in an adhesion test (exfoliation rate (%)). The adhesion test for measuring the exfoliation rate was performed by the cross-cut method.

As shown in FIG. 10, the exfoliation rate decreases as the color difference $\Delta E^*_{ab}$ increases. When the color difference $\Delta E^*_{a}b$ is less than about 1.0, the exfoliation rate is high. This is because a portion of the sealing resin layer 5 is not sufficiently removed by the etching or the reverse sputtering. On the other hand, when the color difference $\Delta E^*_{ab}$ is about 1.0 or more, the exfoliation rate is low. Therefore, by confirming that the color difference $\Delta E^*_{ab}$ is within a predetermined range, it is possible to ensure the adhesion between the sealing resin layer 5 and the shield layer 7 formed later in the shield layer forming step (S8).

In order to obtain high adhesion, the color difference $\Delta E^*_{ab}$ is preferably equal to or greater than a first predetermined value. When the filler 30 contains $SiO_2$, the first predetermined value is, for example, 1.0 to 1.5 from the results shown in FIG. 10. More specifically, the first predetermined value is preferably 1.5. The first predetermined value may be changed depending on the material of the filler 30 and the like.

The control unit 43 (as a first control unit) controls the etching device 41 and the optical property measuring device 42 so as to repeat the etching of the sealing resin layer 5 and the measurement of the optical properties of the surface of the sealing resin layer 5 until the measurement results reach the first predetermined value. That is, the second etching and the actual measurement are alternately repeated until the measurement result of the color difference $\Delta E^*_{ab}$ reaches the first predetermined value. Therefore, if the color difference $\Delta E^*_{ab}$, (that is, the exposed amount of the filler 30) is insufficient, additional etching is performed.

In addition, the control unit 43 (as a second control unit) controls the etching device 41 so as to etch the sealing resin layer 5 by changing the etching conditions according to the measurement results of the optical properties. In this context, the etching conditions that might be changed or varied include, for example, power output control, frequency control, and time control in the case of dry etching using plasma or the like. For example, when the measurement result of the optical properties is significantly different from the first predetermined value, the control unit 43 controls the etching device 41 so as to extend the etching time (see FIG. 12).

As described above, according to the first embodiment, the optical property measuring unit 423 measures (quantifies) the exposed amount of the filler 30 by measuring the optical properties of the surface of the sealing resin layer 5. This makes it easier to measure (quantify) the exposed amount of the filler 30 from the measurement results of the optical properties. In addition, by incorporating the optical property measuring unit 423 into the semiconductor manufacturing apparatus 40, it becomes possible to control (manage) the exposed amount of the filler 30 in the sealing resin layer 5. In addition, in a composite material (sealing resin layer 5+filler 30), even when each material is changed, the method can be applied to measurement (quantification) of the exposed amount of filler 30. When the shield layer 7 is formed on the sealing resin layer 5, the filler 30 and the shield layer 7 are in close contact with each other. By managing the exposed amount of filler 30, it is possible to ensure the adhesion between the sealing resin layer 5 and the shield layer 7. As a result, by checking the exposed amount of the filler 30 in advance by the optical property measuring unit 423, it is possible to reduce the occurrence of poor adhesion of the shield layer 7.

The optical property measuring step (S7) may be performed on all the semiconductor devices 1 or may be performed on just some of the semiconductor devices 1 in the same batch or the like. When the optical property measuring step (S7) is performed on just some of the semiconductor devices 1, the optical property measuring step (S7) is performed on at least one semiconductor device 1 selected from the plurality of semiconductor devices 1 that were etched together in the etching step (S6). In this case, the semiconductor devices 1 not subjected to the optical property measuring step (S7) is still subjected to the shield layer forming step (S8) after the etching step (S6).

Also, in some examples, the reference color may be a preset color rather than a measured value from the same sample as being etched. In this case, the reference color can be stored in a storage unit in the optical property measuring unit 423, and measurement of the reference color of a sample can be omitted.

The optical property measured by the optical property measuring unit 423 is not limited to color difference, and may be any optical property that correlates with the exposed amount of the filler 30. The optical property measuring unit 423 may comprise, for example, a reflectometer that measures the reflectance of the surface of the sealing resin layer 5. In general, the reflectance may be low until the sealing resin layer 5 has been etched. As the exposed amount of the filler 30 increases, the reflectance also increases. Thereby, the exposed amount of the filler 30 can be measured (quantified) using the reflectance measurement result. Further, the optical property measuring unit 423 may include an optical microscope that optically captures an image of the surface of the sealing resin layer 5 and a processing unit that processes the captured image. For example, the processing unit may quantify the brightness by image processing, or may recognize the filler 30 exposed from the sealing resin layer 5 by image recognition. Thereby, the exposed amount of the filler 30 can be measured (quantified).

Also, the optical property measuring device 42 need not be integrated into the semiconductor manufacturing apparatus 40. In this case, the optical properties of the semiconductor device 1 that has been removed from the chamber 411 of the etching device 41 are measured and then a determination as to whether to continue etching is made. When continuing the etching, the semiconductor device 1 is put back into the etching device 41 and the etching is performed again.

Moreover, the etching device 41 is not limited to dry etching, and, in some examples, may partially remove the sealing resin layer 5 by wet etching. In the case of wet etching, the optical property measuring unit 423 generally measures the optical properties after the sealing resin layer 5 has been washed with pure water and dried. The output of the optical property measuring unit 423 is compared with the reference color, fed back to the etching liquid temperature control, concentration control, and/or time control in the case of wet etching, and used to determine the end of processing.

Moreover, the semiconductor manufacturing apparatus 40 may include a chamber for baking the sealing resin layer 5 to remove absorbed moisture before etching.

The semiconductor manufacturing apparatus 40 may further include a film forming device (film forming unit) that forms the shield layer 7 (conductive film) covering the sealing resin layer 5 where the filler 30 is exposed after etching. Examples of the film forming device include a sputtering device, a vapor deposition device, an ion plating device, a screen printing device, a spray coating device, a jet dispensing device, an inkjet device, an aerosol device, an electroless plating device, an electrolytic plating device, and the like.

Further, the optical property measuring device 42 may be incorporated in a film forming device that forms the shield layer 7 in the shield layer forming step (S8).

Further, for the sealing resin layer 5, an epoxy-based, phenol-based, polyimide-based, polyamide-based, acrylic-based, PBO-based, silicone-based, benzocyclobutene-based resin, or mixtures or composites thereof can be used. Examples of epoxy resins are not particularly limited, and include bisphenol type epoxy resins such as bisphenol A type, bisphenol F type, bisphenol AD type, and bisphenol S type; novolak type epoxy resins such as phenol novolak type and cresol novolak type; a resorcinol type epoxy resin, an aromatic epoxy resin such as trisphenol methane triglycidyl ether, a naphthalene type epoxy resin, a fluorene type epoxy resin, a dicyclopentadiene type epoxy resin, a polyether-modified epoxy resin, a benzophenone type epoxy resin, an aniline type epoxy resin, an NBR-modified epoxy resin, a CTBN-modified epoxy resins, and hydrogenated products thereof. Among them, the naphthalene type epoxy resin and the dicyclopentadiene type epoxy resin may be preferable because the adhesion to silicon is good. The benzophenone type epoxy resin may also be preferable in some examples because it is easy to obtain fast curing. These epoxy resins may be used alone or in combinations of two or more.

The filler 30 is, for example, silica, $SiO_2$, glass beads, alumina, aluminum nitride (AlN), boron nitride (BN), beryllium oxide (BeO), carbon black, graphite, carbon fiber, metal powder, metal fiber, metal foil, mica, potassium titanate, xonotlite, ferrite, carbon nanotubes (CNT), titanium oxide, zinc oxide, iron oxide, calcium oxide, magnesium oxide, calcium carbonate, antimony oxide, aluminum hydroxide, magnesium hydroxide, zinc borate, zinc carbonate, hydrotalcite, dawsonite, or, composites, or mixtures thereof. In addition, the surface of the filler may be surface treated to increase adhesion to the resin.

Gases such as Ar, $O_2$, $N_2$, $H_2$, He, $H_2O$, $CF_4$, or the like may be used in the plasma for dry etching. A mixed plasma of two or more of these may be used. Also, a plurality of plasmas such as Ar plasma, $N_2$ plasma, and $O_2$ plasma may be combined.

COMPARATIVE EXAMPLE

As a method for measuring (quantifying) an exposure rate (exposed amount) of the filler 30, binarization processing of SEM (Scanning Electron Microscope) images, or measurement (quantification) of the amount of silicon by XPS analysis may be used. A comparative example using binarization processing of an SEM image will be described below.

Figure 11:
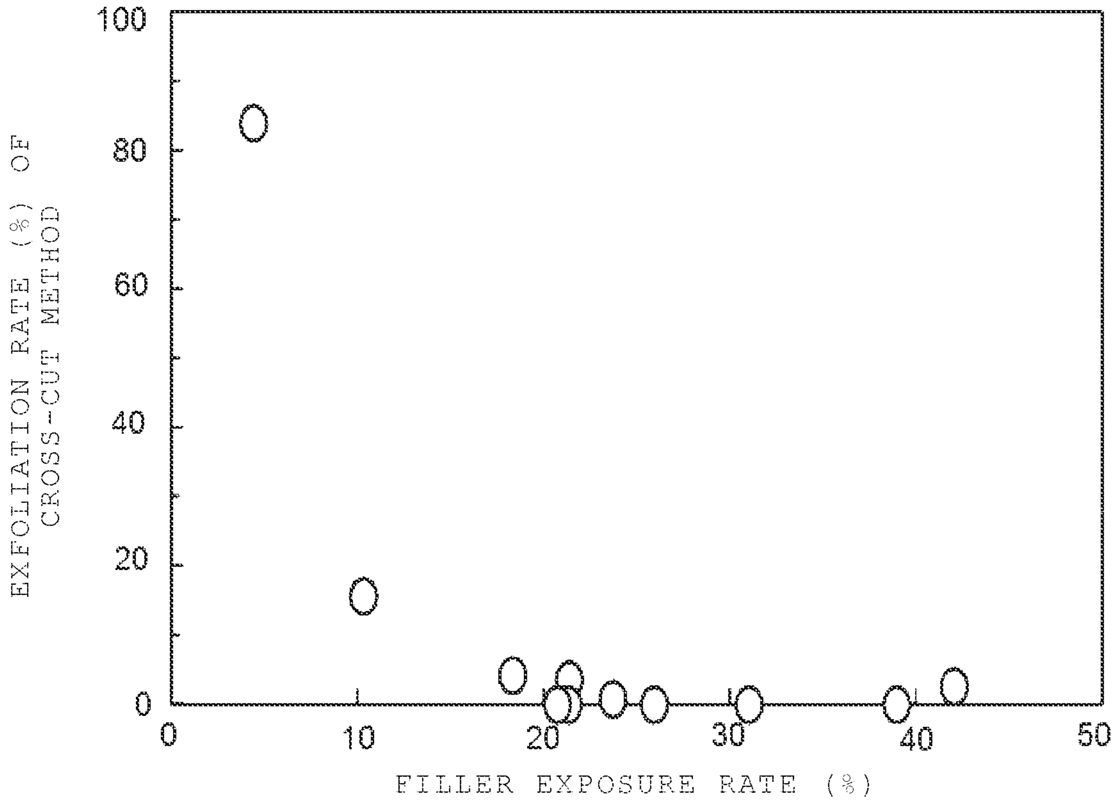
FIG. 11 is a graph depicting results of an adhesion test of a semiconductor device of a comparative example.

FIG. 11 is a graph showing the results of the adhesion test of the semiconductor device 1 according to the comparative example.

In FIG. 11, the horizontal axis indicates the exposure rate (%) of the filler 30, and the vertical axis indicates the exfoliation rate (%) of the cross-cut method. The exposure rate of the filler 30 was obtained by binarizing an SEM image. The adhesion test for measuring the exfoliation rate was performed by the cross-cut method.

As shown in FIG. 11, the exfoliation rate decreases as the exposure rate of the filler 30 increases. When the exposure rate of the filler 30 is less than about 20%, the exfoliation rate is high. On the other hand, when the exposure rate of the filler 30 is approximately 20% or more, the exfoliation rate is low.

From the comparison between FIG. 10 for the first embodiment and FIG. 11 for the comparative example, it can be understood that the relationship between the exfoliation rate and the color difference $\Delta E^*_{ab}$ behaves similarly to the relationship between the exfoliation rate and the exposure rate of the filler 30 obtained from the SEM image.

However, the measurement (quantification) of the exposed amount of the filler 30 using SEM, XPS, or the like takes time, and is troublesome due to the use of advanced analysis techniques and equipment. The measurement (quantification) of the exposed amount of the filler 30 using SEM is performed using an magnified image of the surface of the sealing resin layer 5. Therefore, the measurement (quantification) of the exposed amount of the filler 30 is performed, for example, in a minute area of only several μm square.

In contrast, in the first embodiment, the exposed amount of the filler 30 is measured (quantified) using optical properties such as color difference. This makes it easier to measure (quantify) the exposed amount of the filler 30. Further, when a color difference meter is used as the optical property measuring unit 423, a color difference can be averaged over substantially the entire upper surface of the semiconductor device 1. Therefore, it is possible to macroscopically measure (quantify) the exposed amount of the filler 30, and such a result is less likely to be affected by local variations in the exposed amount of the filler 30.

Modification of First Embodiment

The relationship between a color difference $\Delta E^*_{ab}$ and the etching conditions of the etching step (S6) will be described below.

Figure 12:
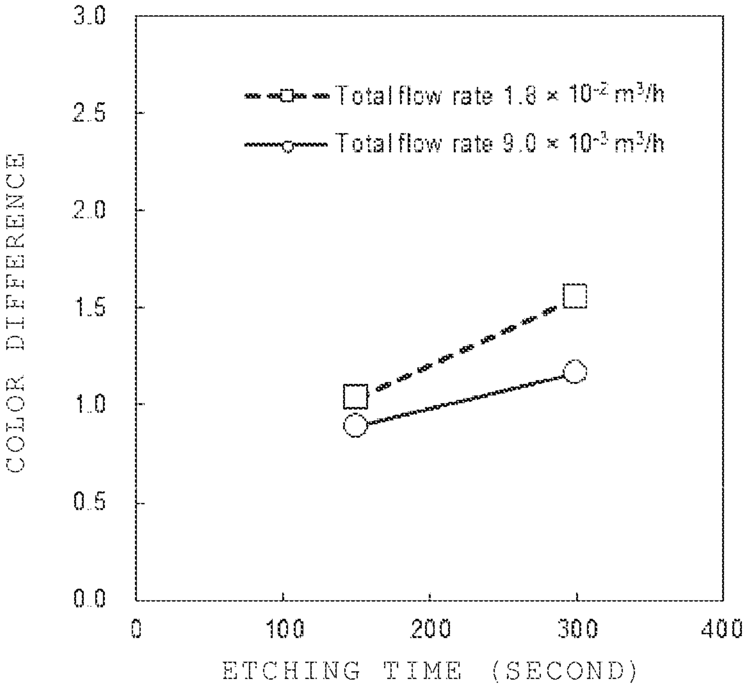
FIG. 12 is a graph depicting a relationship between an etching time and a color difference in a modification of the first embodiment.

FIG. 12 is a graph showing the relationship between etching time and the color difference $\Delta E^*_{ab}$ in this modification of the first embodiment.

In FIG. 12, the horizontal axis indicates the etching time, and the vertical axis indicates a measured color difference $\Delta E^*_{ab}$ for the surface of the sealing resin layer 5.

Each circle indicates a sample etched using a total flow rate of $9.0\times10^{-3}$ $m^3/h$ for argon gas and nitrogen gas, and each square mark indicates a sample etched with a total flow rate of $1.8\times10^{-2}$ $m^3/h$ for argon gas and nitrogen gas. Argon gas and nitrogen gas have the same flow rate as one another in each case. The etching power output is 800 W for these samples.

As shown in FIG. 12, the longer the etching time, the greater the color difference $\Delta E^*_{ab}$. Also, from the comparison between the circle-marked sample and the square-marked sample, the color difference $\Delta E^*_{ab}$ increases for total gas flow rate increases.

Therefore, the color difference $\Delta E^*_{ab}$ can be controlled by adjusting the etching time and/or the total gas flow rate. That is, the exposed amount of the filler 30 can be controlled by adjusting these etching conditions.

Figure 13:
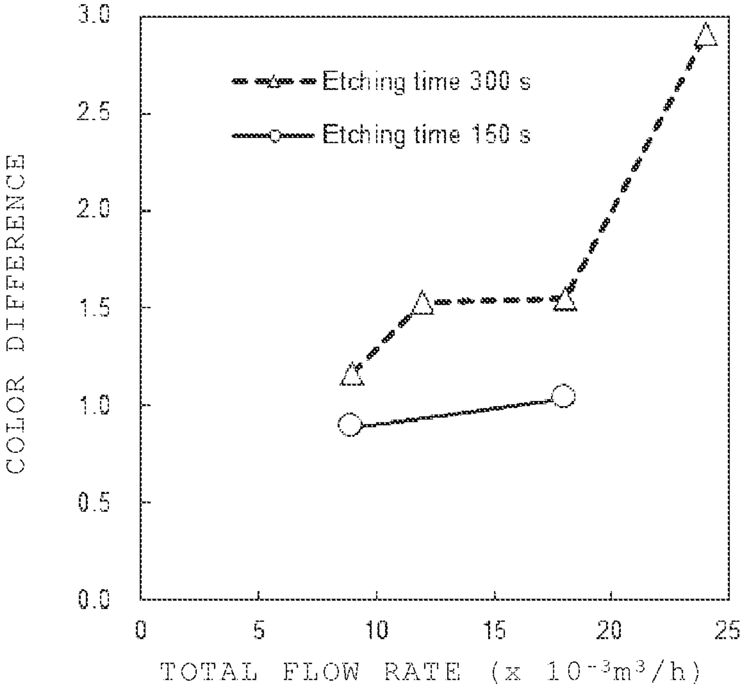
FIG. 13 is a graph depicting a relationship between a total gas flow rate and the color difference in the modification of the first embodiment.

FIG. 13 is a graph showing the relationship between total gas flow rate (etch condition) and the color difference $\Delta E^*_{ab}$ in the modification of the first embodiment.

In FIG. 13, the horizontal axis indicates the total flow rate ($m^3/h$) of argon gas and nitrogen gas, and the vertical axis indicates the color difference $\Delta E^*_{ab}$ on the surface of the sealing resin layer 5 after etching. Argon gas and nitrogen gas have the same flow rate.

Each circle indicates a sample etched for 150 seconds, and each triangle indicates a sample etched for 300 seconds. The etching power output is 800 W.

As shown in FIG. 13, the greater the total flow rate of argon gas and nitrogen gas, the greater the color difference $\Delta E^*_{ab}$. In addition, from the comparison between the circle-marked sample and the triangle-marked sample, the longer the etching time, the greater the color difference $\Delta E^*_{ab}$.

Therefore, by adjusting the total flow rate of argon gas and nitrogen gas and/or the etching time, the color difference $\Delta E^*_a b$ can be controlled. That is, the exposed amount of the filler 30 can be controlled by adjusting these etching conditions.

Figure 14:
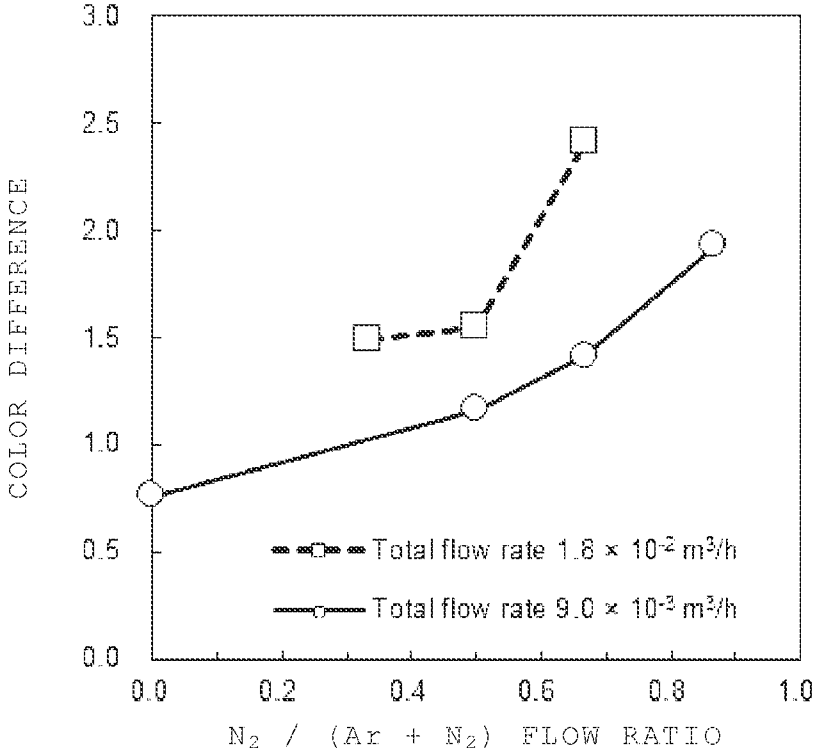
FIG. 14 is a graph depicting a relationship between a gas flow ratio and the color difference in the modification of the first embodiment.

FIG. 14 is a graph showing the relationship between a gas flow ratio (mix) and a color difference $\Delta E^*_{ab}$ in the modification of the first embodiment.

In FIG. 14, the horizontal axis indicates the ratio of the flow rate of nitrogen gas to the total flow rate of argon gas and nitrogen gas, and the vertical axis indicates the color difference $\Delta E^*_{ab}$ of the surface of the sealing resin layer 5.

Each circle indicates a sample etched with a total flow rate of $9.0\times10^{-3}$ $m^3/h$ of argon gas and nitrogen gas, and each square mark indicates a sample etched with a total flow rate of $1.8\times10^{-2}$ $m^3/h$ of argon gas and nitrogen gas. The etching power output is 800 W.

As shown in FIG. 14, the color difference $\Delta E^*_{ab}$ increases as the ratio of nitrogen gas flow to the total flow of argon gas and nitrogen gas increases. Also, from the comparison between the circle-marked sample and the square-marked sample, the color difference $\Delta E^*_{ab}$ increases as the total gas flow rate increases.

Therefore, by adjusting the gas ratio and/or the total gas flow rate, the color difference $\Delta E^*_{ab}$ can be controlled. That is, the exposed amount of the filler 30 can be controlled by adjusting these etching conditions.

Thus, various etching conditions may be adjusted to control the exposed amount of filler 30. The manufacturing method of a semiconductor device and the semiconductor manufacturing apparatus 40 according to the first modification of the first embodiment can obtain the same effects as those of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A manufacturing method, comprising:

etching a resin so that a filler is exposed from a surface of the resin containing the filler;

measuring an exposed amount of the filler by measuring optical properties of the surface of the resin; and forming a conductive film on the surface of the resin after the measuring of the optical properties, wherein measuring the optical properties of the surface of the resin includes:

measuring a color of the surface of the resin, and calculating a color difference between a reference color and the measured color of the surface of the resin, etching the resin includes a cleaning etch to clean the surface of the resin followed by a second etch to remove portions of the resin, the cleaning etch and the second etch are each a plasma process, the cleaning etch is performed using a first gas that includes argon and does not include nitrogen, and the second etch is performed using a second gas that includes both argon and nitrogen.

2. The manufacturing method according to claim 1, wherein the reference color is a measured color of the surface of the resin after the cleaning etch.

3. The manufacturing method according to claim 1, wherein the reference color is a preset color set based on prior measurements of a reference sample.

4. The manufacturing method according to claim 1, further comprising:

repeatedly performing the etching of the resin and the measuring of the optical properties of the surface of the resin until the measured optical properties reach a first predetermined value.

5. The manufacturing method according to claim 1, further comprising:

changing etching conditions for a subsequent etching of the resin according to the measured optical properties.

6. The manufacturing method according to claim 1, wherein the filler comprises at least one of silica, silicon dioxide, glass beads, alumina, aluminum nitride, boron nitride, beryllium oxide, carbon black, graphite, carbon fiber, metal powder, metal fiber, metal foil, mica, potassium titanate, xonotlite, ferrite, carbon nanotubes, titanium oxide, zinc oxide, iron oxide, calcium oxide, magnesium oxide, calcium carbonate, antimony oxide, aluminum hydroxide, magnesium hydroxide, zinc borate, zinc carbonate, hydrotalcite, and dawsonite.

7. The manufacturing method according to claim 1, further comprising:

mounting a semiconductor chip on a substrate before the etching; and covering the semiconductor chip with the resin before the etching.

8. The manufacturing method according to claim 1, wherein measuring the optical properties further includes measuring a reflectance of the surface of the resin.

9. The manufacturing method according to claim 1, wherein measuring the optical properties of the surface of the resin includes:

capturing an optical image of the surface of the resin, and performing image processing on the captured optical image.

* * * * *